US006495381B2

United States Patent
Song et al.

(10) Patent No.: US 6,495,381 B2
(45) Date of Patent: Dec. 17, 2002

(54) APPARATUS AND METHOD FOR FORMING APERTURE OF VERTICAL CAVITY SURFACE EMITTING LASER BY SELECTIVE OXIDATION

(75) Inventors: Young-jin Song, Yongin (KR); Seung-ho Nam, Seongnam (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 102 days.

(21) Appl. No.: 09/751,938

(22) Filed: Jan. 2, 2001

(65) Prior Publication Data

US 2002/0173061 A1 Nov. 21, 2002

(30) Foreign Application Priority Data

May 18, 2000 (KR) ............................................. 00-26710

(51) Int. Cl.[7] ............................... H01S 3/08; H01S 3/13
(52) U.S. Cl. ................... 438/22; 372/103; 372/29.022; 372/99; 438/22; 438/16
(58) Field of Search ................... 438/16, 22; 372/103, 372/29.022, 99

(56) References Cited

U.S. PATENT DOCUMENTS

| 5,115,441 | A | * | 5/1992 | Kopf et al. | 372/45 |
|---|---|---|---|---|---|
| 5,425,043 | A | * | 6/1995 | Holonyak et al. | 372/23 |
| 5,574,738 | A | * | 11/1996 | Morgan | 372/28 |
| 5,699,375 | A | * | 12/1997 | Paoli | 372/23 |
| 5,991,326 | A | * | 11/1999 | Yuen et al. | 372/45 |
| 6,026,108 | A | * | 2/2000 | Lim et al. | 372/28 |
| 6,055,262 | A | * | 4/2000 | Cox et al. | 372/45 |
| 6,062,476 | A | * | 5/2000 | Stern et al. | 235/462.35 |
| 6,148,016 | A | * | 11/2000 | Hegblom et al. | 372/102 |
| 6,171,982 | B1 | * | 1/2001 | Sato | 432/200 |
| 6,269,109 | B1 | * | 7/2001 | Jewell | 372/43 |
| 6,314,118 | B1 | * | 11/2001 | Jayaraman et al. | 372/46 |
| 6,320,893 | B1 | * | 11/2001 | Ueki | 372/45 |
| 6,327,293 | B1 | * | 12/2001 | Salokatve et al. | 372/70 |
| 6,365,237 | B1 | * | 4/2002 | Peake et al. | 427/162 |
| 6,366,597 | B1 | * | 4/2002 | Yuen et al. | 372/96 |
| 6,372,533 | B2 | * | 4/2002 | Jayaraman et al. | 438/22 |
| 6,411,638 | B1 | * | 6/2002 | Johnson et al. | 257/98 |
| 2001/0019566 | A1 | * | 4/2001 | Jewell | 372/43 |

* cited by examiner

Primary Examiner—Hoai Ho
Assistant Examiner—Ly Duy Pham
(74) Attorney, Agent, or Firm—Sughrue Mion, PLLC

(57) ABSTRACT

An apparatus and method for forming an aperture of a vertical cavity surface emitting laser (VCSEL) by selective oxidation, in which resonance peak variations during the formation of the aperture can be measured using an optical spectrum analyzer, so that the size of the aperture can be precisely adjusted. The aperture forming apparatus includes: a furnace having a first window and a second window for transmitting light, and a stage for supporting a wafer for the VCSEL with a pre-oxide layer where an aperture is to be formed; a light source placed outside the furnace, for emitting light through the first window onto the top of the wafer seated on the stage; and an optical spectrum analyzer for detecting the light intensity by receiving light reflecting from the top of the wafer for the VCSEL and passing through the second window.

1 Claim, 4 Drawing Sheets

APPARATUS AND METHOD FOR FORMING APERTURE OF VERTICAL CAVITY SURFACE EMITTING LASER BY SELECTIVE OXIDATION

BACKGROUND OF THE INVENTION

1. Field of the Invention

The present invention relates to an apparatus and method for forming an aperture of a vertical cavity surface emitting laser (VCSEL) by selective oxidation and, more particularly, to an apparatus for and method of forming a precise aperture of a VCSEL, while monitoring resonance peak variations through an optical spectrum analyzer.

2. Description of the Related Art

Unlike edge emitting laser devices, VCSELs emit a substantially circular beam in the direction in which semiconductor material layers are stacked, so that it is unnecessary to adopt an optical system for shaping the output beam. Also, the size of VCSELs is reducible, and thus it is easy to integrate a plurality of VCSELs in a 2-dimensional array on a single semiconductor wafer. These advantages have expanded the application fields of VCSELs, for example, into optical communications, electronic calculators, audio & video apparatuses, laser printers, laser scanners and medical equipment.

In order to enhance power output characteristics by guiding the flow of current supplied through electrodes, a VCSEL is provided with a high-resistance region in an upper reflector. The high-resistance region can be formed by implanting protons or ions into the upper reflector, and by selectively oxidizing the peripheral region exclusive of an aperture that guides the flow of current, by adjusting the oxidizing time. A disadvantage of the implantation method lies in that it lacks repeatability in high volume manufacturing, because of a non-uniform distribution of protons or ions.

On the other hand, as for the selective oxidation method, after depositing an $Al_{1-x}Ga_xAs$ layer on a lower portion of an upper reflector, which is to be a high-resistance region, the resultant structure is etched, resulting in individual VCSELs on a wafer. Next, the VCSELs are left in an oxidation atmosphere for a predetermined period of time, to allow diffusion of vapor into the peripheral portion of the $Al_{1-x}Ga_xAs$ layer. As a result, an oxide insulating layer, $Al_2O_x$ layer, is formed at the peripheral portion as the high-resistance region, which limits flow of current, thereby resulting in an aperture surrounded by the high-resistance region.

The oxidative diffusion rate in forming an aperture of a VCSEL is highly sensitive to the temperature of a furnace for use in the oxidative diffusion, oxidation time and the amount of oxygen supplied into the furnace. A variation in the diffusion rate is a fatal problem in mass production that requires high repeatability, and in forming a particular size of the aperture.

To overcome these problems, it would be desirable to employ a furnace with precise temperature control, and to precisely adjust oxygen or vapor pressure in the furnace. However, in the case where the length of an oxidative diffusion region needs to be adjusted on the order of $\pm 1\mu m$, precisely adjusting temperature and oxygen or vapor pressure is insufficient. In other words, the area of the $Al_{1-x}Ga_xAs$ layer to be oxidized during the process needs to be measured, and the length of the oxidative diffusion region must be monitored through a visual system. In practice, it is difficult to construct an optical system having a high enough magnification ratio to easily observe something so small.

The size of the aperture can be adjusted using a dummy sample. In particular, the length of the oxidative diffusion region is measured with respect to dummy samples so as to determine an appropriate oxidation time period. Then, the obtained oxidation time period is applied to form a desired aperture on an actual sample. However, the repeatability of this method is poor.

SUMMARY OF THE INVENTION

To solve the above problems, it is an objective of the present invention to provide an apparatus and method for forming an aperture of a vertical cavity surface emitting laser (VCSEL) by selective oxidation, in which the degree of oxidation during the formation of the aperture is adjusted by measuring a variation in a resonance peak, which depends on the size of the aperture, using an optical spectrum analyzer, so that the size of the aperture can be precisely adjusted.

According to an aspect of the present invention, there is provided an apparatus for forming an aperture of a vertical cavity surface emitting laser (VCSEL) by selective oxidation, comprising: a furnace having a first window and a second window for transmitting light, and a stage for supporting a wafer for the VCSEL with a pre-oxide layer where an aperture is to be formed; a light source placed outside the furnace, for emitting light through the first window onto the top of the wafer for the VCSEL seated on the stage; and an optical spectrum analyzer for detecting the light intensity by receiving light reflecting from the top of the wafer for the VCSEL and passing through the second window, wherein the size of the aperture created can be controlled based on the variation of a peak wavelength, which varies according to the degree of oxidation of the pre-oxide layer.

According to another aspect of the present invention, there is provided a method of forming an aperture of a VCSEL by selective oxidation, comprising: providing a furnace having a stage, and first and second windows for transmitting light, and placing a wafer for the VCSEL with a pre-oxide layer where an aperture is to be formed, on the stage; emitting light onto the top of the wafer for the VCSEL seated on the stage through the first window; receiving light reflecting from the wafer for the VCSEL and passing through the second window; supplying at least one of oxygen and water vapor into the furnace to create an oxidation atmosphere; detecting a peak wavelength variation from light received through the second window, which varies according to the degree of oxidation of the pre-oxide layer; and adjusting power and/or oxidation atmosphere of the furnace based on the detected peak wavelength variation to cease the oxidation reaction, thereby adjusting the size of the aperture.

BRIEF DESCRIPTION OF THE DRAWINGS

The above objective and advantages of the present invention will become more apparent by describing in detail preferred embodiments thereof with reference to the attached drawings, in which.

DETAILED DESCRIPTION OF THE PREFERRED EMBODIMENT

Figure 1:
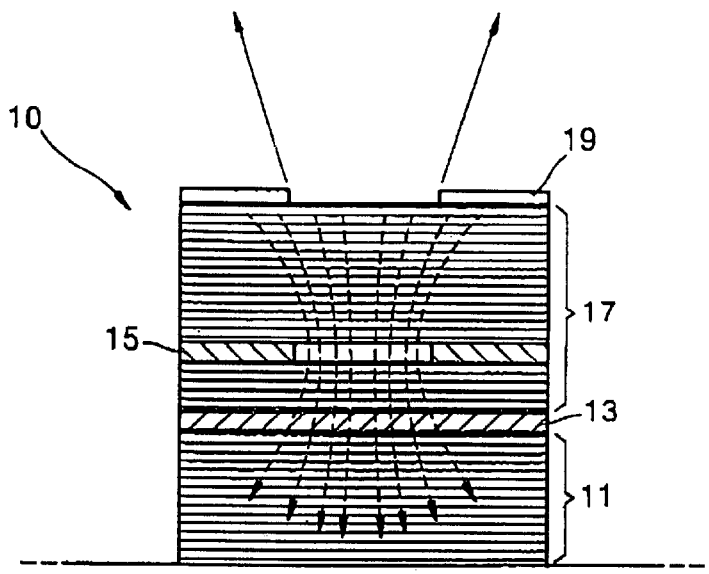
FIG. 1 is a schematic sectional view of a vertical cavity surface emitting laser (VCSEL) with an aperture formed by a conventional selective oxidation method.

Referring to FIG. 1, a vertical cavity surface emitting laser (VCSEL) includes a lower reflector 11, an active layer 13, a pre-oxide layer 15 in which an aperture is to be formed by partial oxidation, and an upper reflector 17, which are consecutively stacked on a wafer. An upper electrode 19 is disposed on the upper reflector 17.

The wafer is formed of a semiconductor material containing an n-type dopant, and a plurality of VCSELs can be formed simultaneously on the same wafer. In FIG. 1, only a single VCSEL is shown. The lower reflector 11 is formed by depositing a semiconductor material which is different from the semiconductor material used for the wafer, but is doped with the same type of dopant, i.e., n-type. The upper reflector 17 is formed of the same semiconductor material as the lower reflector, but is doped with the opposite type of dopant, i.e., p-type. The upper reflector 17 and the lower reflector 11 guide the flow of electrons and holes with the application of current through the upper electrode 19 and a lower electrode (not shown). The active layer 13, which has a single or multiple quantum-well structure, i.e., super lattice structure, emits light to undergo energy level transition caused by recombination of electrons and holes.

The pre-oxide layer 15 is formed in the lower portion of the upper reflector 17, near the active layer 13, of p-type $Al_xGa_{1-x}As$. In the pre-oxide layer 15, a predetermined sized aperture capable of passing light emitted from the active layer 13, and an insulating oxide region formed of $Al_2O_x$ surrounding the aperture, are formed by selective oxidation using an aperture forming apparatus, as shown in FIG. 2.

Figure 2:
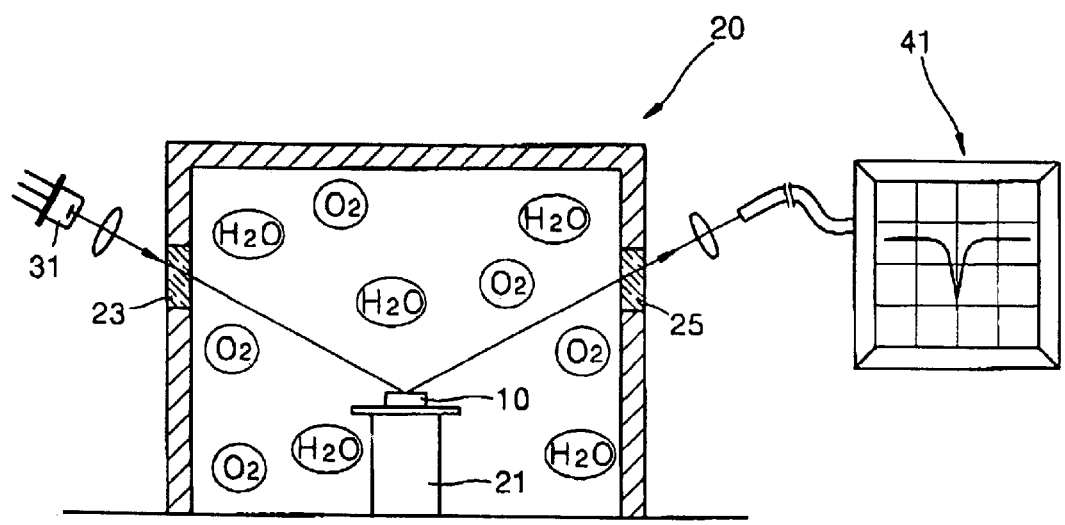
FIG. 2 is a schematic view of an apparatus for forming an aperture of a VCSEL according to a preferred embodiment of the present invention.

Referring to FIG. 2, the aperture forming apparatus according to a preferred embodiment of the present invention, whose atmosphere is controlled to be at a predetermined temperature and pressure suitable for oxidation, is comprised of a furnace 20 in which the wafer 10 for the VCSEL is installed for forming an aperture of the VCSEL, a light source 31 for emitting light onto the top of the wafer 10, and an optical spectrum analyzer 41 for detecting the light intensity by receiving light emitted from the light source 31 and reflected from the wafer 10.

The furnace 20 includes a stage 21 for supporting the wafer 10, and first and second windows 23 and 25 for passing incident light. The first and second windows 23 and 25 are formed of a transparent member, and thus the furnace 20 can be sealed from the outside as well as can transmit light. The atmosphere of the furnace 20 is conditioned to be an oxidation atmosphere including oxygen and/or water vapor ($H_2O$), and the furnace 20 is able to adjust its power and/or oxidation atmosphere based on a signal detected by the optical spectrum analyzer 41 to cease the oxidation reaction, thereby adjusting the size of the aperture.

The light source 31 is placed outside the furnace 20, and emits light through the first window 23 onto the top of the wafer 10 seated on the stage 21. The optical spectrum analyzer 41 is placed outside the furnace 20, and receives light through the second window 25, which has been reflected from the surface of the wafer 10, and outputs light intensity variations. The wafer 10 has a Fabry-Perot etalon resonator structure, and thus it is able to oscillate by light emitted from the external light source 31. As the light source 31 emits light, incident light is reflected by the wafer 10 and is incident on the optical spectrum analyzer 41. The optical spectrum analyzer 41 detects a negative peak at a predetermined wavelength, due to a drop in the reflectivity of the pre-oxide layer 15. The peak wavelength detected by the optical spectrum analyzer 41 varies according to the degree of oxidation of the wafer 10.

Figure 3A:
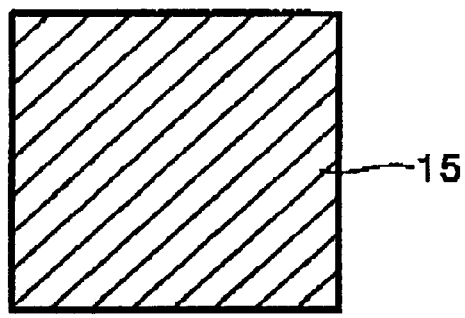
FIGS. 3A and 3B are plan views showing an aperture before and after oxidation, respectively.
Figure 3B:
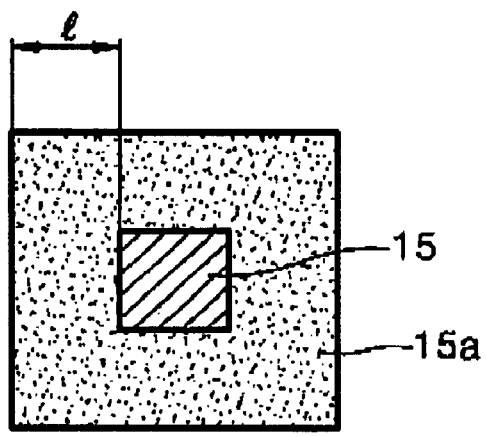

After the pre-oxide layer 15 formed of $Al_{1-x}Ga_xAs$, as shown in FIG. 3A, is partially oxidized into an $Al_2O_x$ layer 15a, as much as a predetermined length l, as shown in FIG. 3B, the optical thickness (n>d) of the wafer 10 varies according to a variation in refractive index (n) and a reduction in physical thickness (d) of the resonator between the upper and lower reflectors of the wafer 10.

Figure 4:
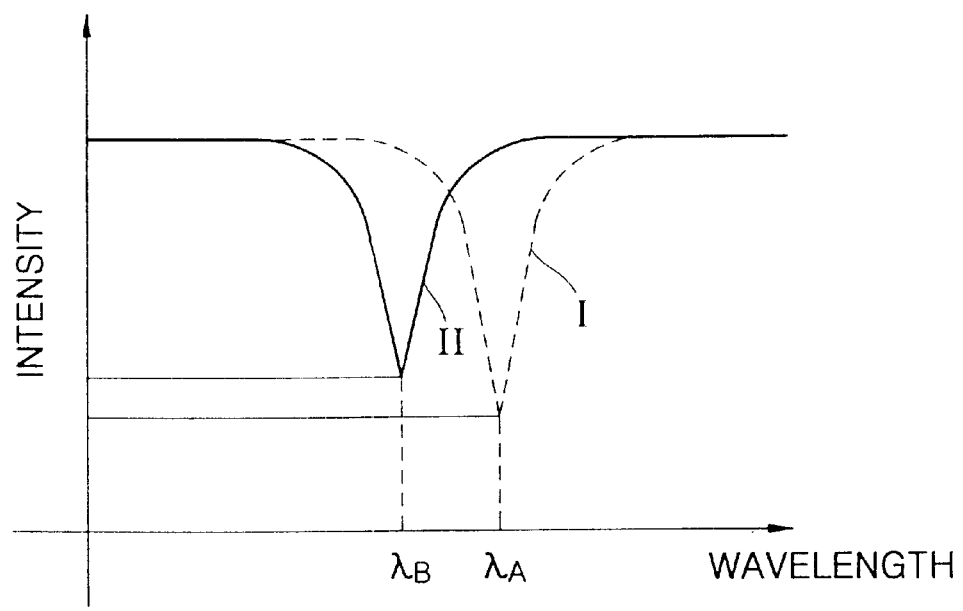
FIG. 4 is a graph showing the light intensity variation with respect to the size of the aperture, which was measured using an optical spectrum analyzer.

As shown in FIG. 4, the peak detected by the optical spectrum analyzer 41 is shifted from Peak I to Peak II. In other words, as the oxidation of the pre-oxide layer 15 progresses, the peak wavelength becomes shorter. Assuming that the wavelength of a target resonance peak is $\lambda B$ and the wavelength of an actual resonance peak detected by the optical spectrum analyzer 41 is $\lambda A$, the selective oxidation is stopped as soon as the actual resonance peak wavelength $\lambda A$ reaches the target resonance peak wavelength $\lambda B$, so that the degree of oxidation of the pre-oxide layer 15 can be controlled.

Figure 5:
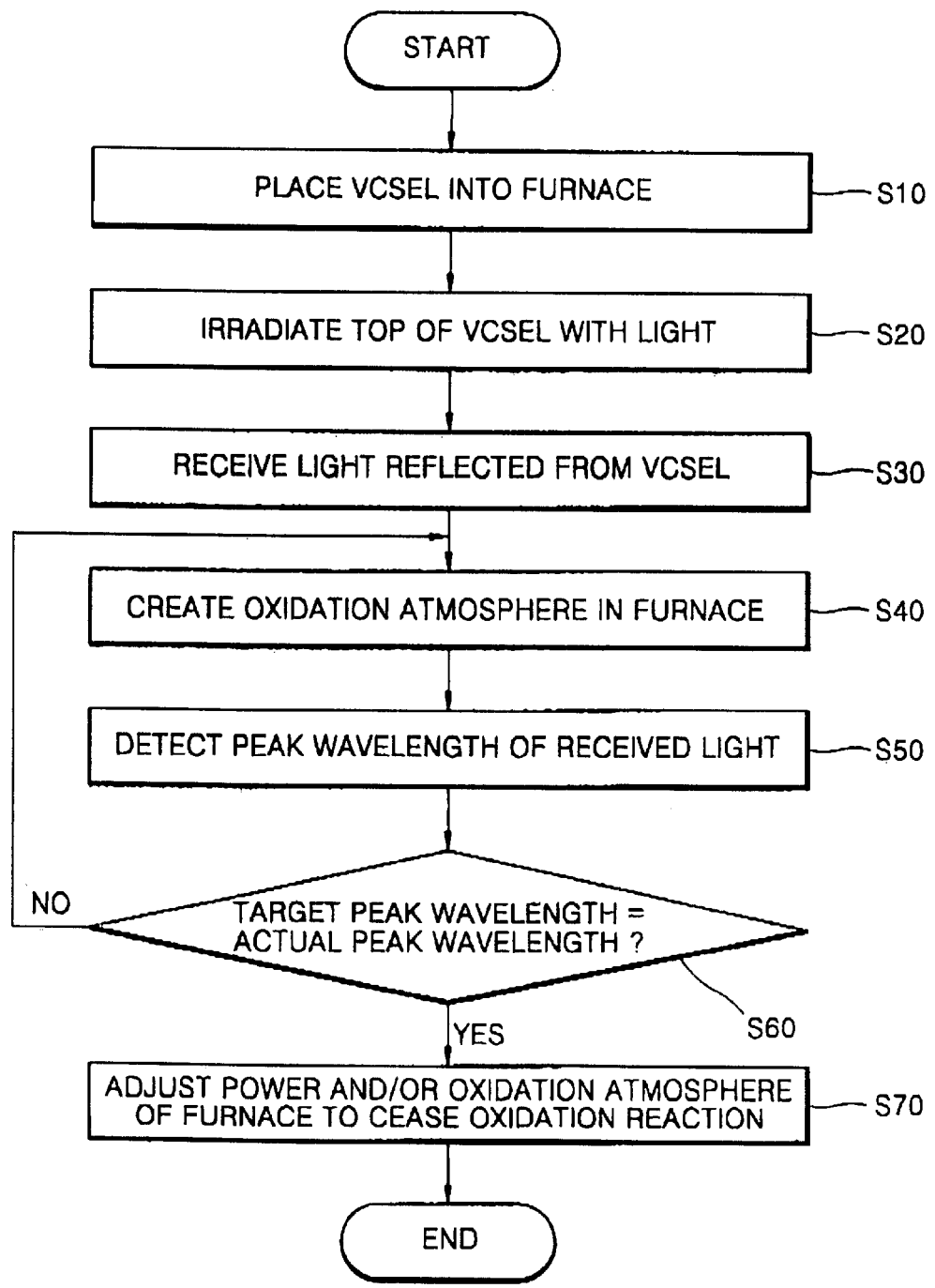
FIG. 5 is a flowchart illustrating a method for forming an aperture of a VCSEL by selective oxidation according to a preferred embodiment of the present invention.

In a method of forming an aperture of a VCSEL by selective oxidation according to a preferred embodiment of the present invention, referring to FIGS. 1, 2 and 5, the furnace 20 having the stage 21 and the first and second windows 23 and 25 is provided, and a wafer 10 or the VCSEL with a pre-oxide layer 15 where an aperture is to be formed is placed on the stage 21 (S10). The top of the wafer 10 is irradiated with light originating from the light source 31 and passing through the first window 23 (S20). The optical spectrum analyzer 41 receives light reflecting from the top of the wafer 10 and passing through the second window 25 (S30). Oxygen and/or water vapor ($H_2O\uparrow$) are supplied into the furnace 20 to create an oxidation atmosphere (S40). The optical spectrum analyzer 41 detects a peak wavelength variation from light received through the second window 25, which varies according to the degree of the oxidation of the pre-oxide layer 15 (S50). Next, it is determined whether the peak wavelength detected by the optical spectrum analyzer 41 is the same as a predetermined target peak wavelength corresponding to a desired aperture size (S60). If the detected peak wavelength reaches the predetermined target wavelength, the power applied to and/or oxidation atmosphere surrounding the wafer 10 are adjusted to prevent further progress of the oxidation (S70), thereby resulting in a complete aperture on the wafer 10 for the VCSEL.

As previously described, in the apparatus for and method of forming an aperture of a VCSEL by selective oxidation according to the present invention, the degree of oxidation can be adjusted by measuring resonance wavelength variations, which depend on the size of the aperture, using an optical spectrum analyzer, so that the size of the aperture can be precisely adjusted in forming the VCSEL.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. An apparatus for forming an aperture of a vertical cavity surface emitting laser (VCSEL) by selective oxidation, comprising:

a furnace having first and second windows for transmitting light, and a stage for supporting a wafer for the VCSEL with a pre-oxide layer where an aperture is to be formed;

a light source placed outside the furnace, for emitting light through the first window onto a top of the wafer for the VCSEL seated on the stage; and an optical spectrum analyzer for detecting a light intensity by receiving light reflecting from the top of the wafer for the VCSEL and passing through the second window, wherein a size of the aperture created is controlled based on a variation of a peak wavelength from light received through the second window, which varies according to a degree of oxidation of the pre-oxide layer.

* * * * *